United States Patent [19]

Reid

[11] 4,216,350
[45] Aug. 5, 1980

[54] MULTIPLE SOLDER PRE-FORM WITH NON-FUSIBLE WEB

[75] Inventor: Gilbert R. Reid, Norristown, Pa.

[73] Assignee: Burroughs Corporation, Detroit, Mich.

[21] Appl. No.: 956,852

[22] Filed: Nov. 1, 1978

[51] Int. Cl.³ .............................................. H05K 3/34
[52] U.S. Cl. .................................... 174/68.5; 228/56; 228/246
[58] Field of Search ................. 228/56, 245, 246, 255; 29/626, 522; 206/486, 329, 328; 174/68.5

[56] References Cited

U.S. PATENT DOCUMENTS

| | | | |
|---|---|---|---|
| 3,396,894 | 8/1968 | Ellis | 228/56 |
| 3,472,365 | 10/1969 | Tiedema | 206/486 |
| 3,744,129 | 7/1973 | Dewey, Jr. | 228/56 X |
| 4,099,615 | 7/1978 | Lemke et al. | 206/328 |
| 4,142,286 | 3/1979 | Knuth et al. | 29/626 |

Primary Examiner—Milton S. Mehr
Assistant Examiner—K. J. Ramsey
Attorney, Agent, or Firm—Francis A. Varallo; Leonard C. Brenner; Kevin R. Peterson

[57] ABSTRACT

In accordance with the present invention, there is provided a non-fusible web for supporting a plurality of individual solder rings in a predetermined pattern homologous with that of a plurality of solder tails or terminals on which the rings are disposed during a soldering operation. The invention finds particular application in vapor phase condensation soldering. Use of the non-fusible web provides for the simultaneous placement of a large number of individual solder rings, while eliminating the erratic and often detrimental flow characteristics occurring during the instantaneous fusion of patterned chains or strings of solder rings during a condensation soldering operation.

1 Claim, 4 Drawing Figures

MULTIPLE SOLDER PRE-FORM WITH NON-FUSIBLE WEB

BACKGROUND OF THE INVENTION

Present day packaging of electronic equipment frequently involves the soldering of electronic components and connectors containing solid state devices to an interconnection medium such as a printed circuit board. Where high density packaging is required, such as in the computer field, the fine detail of the interconnections on such circuit boards does not result in a sufficient quantity of solder around the terminal-receiving holes in the boards to insure a good solder connection. Accordingly, it has been expedient to place individual solder rings upon each terminal or solder-tail after they have been inserted through the corresponding holes in the printed circuit board and prior to the soldering operation. Since connectors may involve hundreds of terminals, the task of placing a ring on each is extremely laborious and time consuming.

In order to eliminate the problems associated with the handling of individual solder rings, present day practice has been to employ chains or strings of solder rings formed in a specified pattern matching that of the solder-tails of the device to be mounted on the board. However, this technique has produced an even more serious problem. Vapor phase condensation soldering, wherein all of the board soldering is accomplished simultaneously, is often preferred for the speed of the soldering operation and the relatively moderate temperatures utilized—the latter being non-damaging to the circuit boards. On the other hand, in condensation soldering, the instantaneous fusion of all of the rings in the patterned chain has resulted in erratic solder flow characteristics. That is, one or more molten rings may not remain at their respective locations, but may flow instead to other terminals being soldered if the flow path to the latter offers less resistance. This leaves some terminals with an excess of solder, and others, with insufficient solder to provide an adequate joint.

It is apparent from the foregoing considerations that while it is desirable to achieve simultaneous multiple placement of solder rings upon the terminals to be soldered in order to make the task less tedious and time consuming, it is necessary that a condensation soldering operation be able to be employed without detrimental effects. The present invention accomplishes these goals.

SUMMARY OF THE INVENTION

In accordance with the present invention, a web of non-fusible material having a plurality of apertures homologous with those of the terminals to be soldered to the board, is used to hold within the respective apertures a plurality of individual solder rings. The web loaded with rings permits the disposition of large numbers of the latter upon the corresponding terminals at one time.

The web may be constructed of various materials, each having the characteristics of being non-fusible at the soldering temperature, and being non-wetted by the solder so as not to interfere with the formation of the solder joint. These materials include, but are not limited to, various plastics, aluminum and its alloys, stainless steel and ceramics.

In general, the web bearing the solder rings is disposed adjacent the terminals protruding from the side of the printed circuit board opposite to that in proximity to the body of the electronic component being mounted. In this instance, the webs are reusable in subsequent soldering operations. However, the loaded web may also be interposed between the component body and the board. After the component terminals have been soldered in place, the web which is assumed to be of electrically insulative material is permitted to remain and serves as a permanent spacer and insulator. Another application may involve a packaging configuration which precludes the removal of the web after the soldering process. In these cases, if the presence of the web is undesirable, a web material may be utilized which while non-fusible in the heat of soldering, may be dissolved by a suitable solvent applied thereto.

The present invention provides a simple, economical solution to the problems involved in the mass soldering of electrical terminals. An advantage of the invention not mentioned hereinbefore is that webs having all of the configuration used in a particular application may be preloaded with solder rings at any convenient time and stored for future use. This eliminates the loss of production time occasioned by the handling of individual solder rings for each assembly just prior to soldering. Other features and advantages will become apparent in the detailed description of the invention which follows.

DESCRIPTION OF THE PREFERRED EMBODIMENT

Figure 1:
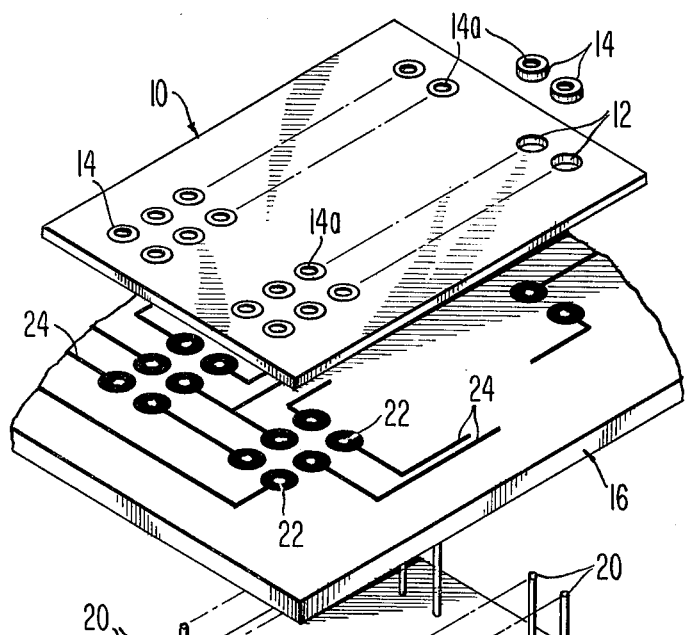
FIG. 1 is an exploded view of the multiple solder pre-form of the present invention with its non-fusible web shown in relation to a printed circuit board and electrical connector.

The present invention of a multiple solder pre-form is best appreciated when considered in an electronic packaging environment. FIG. 1 illustrates in somewhat simplified form such an environment, although it should be understood that the invention is not limited thereto.

With reference to FIG. 1, a non-fusible web 10 having a plurality of apertures 12 for receiving respective individual solder rings 14 is depicted. The aperture 12 may be formed as clear-through holes with parallel sides, or the side walls may be slightly tapered. In either case, when the solder rings 14 are pressed into the apertures 12 either manually or in an automated process, they tend to expand slightly and exert a holding force upon the sides of the apertures.

A printed circuit board 16 is provided for mounting an electrical connector 18, which may be of the type for receiving an electronic device such as an integrated circuit package (not shown). The connector 18 includes a body portion 18a having a plurality of solder tails or terminals 20 emanating therefrom. As will be seen in greater detail in FIG. 2, the terminals 20 pass through corresponding openings 22 formed in the printed wiring 24 of the circuit board 16. Likewise, the apertures 12 of the non-fusible web 10 are arranged in homologous fashion with respect to the terminals 20 of connector 18.

Figure 2:
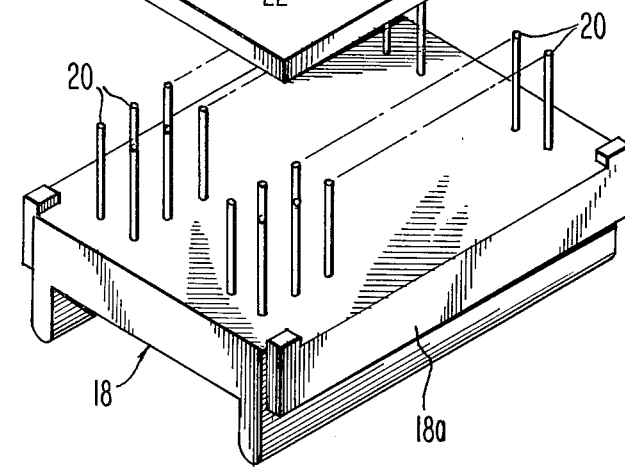
FIG. 2 depicts the components of FIG. 1 in an assembled condition as they are normally disposed prior to soldering.

In FIG. 2, the elements of FIG. 1 have been brought together to depict their physical disposition just prior to a soldering operation. The terminals 20 of connector 18 which are to be soldered to the printed wiring 24 of board 16 protrude through the openings 22 in the latter. The body portion 18a of connector 18 rests upon one side of the board 16. The web 10, loaded with solder rings 14 is positioned adjacent the opposite side of board 16 by permitting the terminals 20 to pass through the corresponding holes 14a in the solder rings 14.

The assembly of FIG. 2 may now be subjected to a soldering operation, such as condensation soldering in which a temperature of 421 degrees Farenheit is applied to the entire solder pre-form. All of the rings 14 in the web 10 are fused simultaneously, forming respective solder joints at the junction of the terminals 20 and the printed wiring 24 adjacent the openings 22 of the board 16. The web 10 which is formed of material substantially not affected by the heat employed in soldering, provides a high resistance path to solder flow between the solder rings 14. This, in turn, insures that each molten ring remains in its specified location. Moreoever, since the web 10 is constructed of material to which the solder will not adhere, it does not interfere with the formation of the solder joints. Following the soldering operation, the web 10 may be easily removed, and after being loaded with new solder rings, may be reused over a large number of subsequent soldering cycles.

Figure 3:
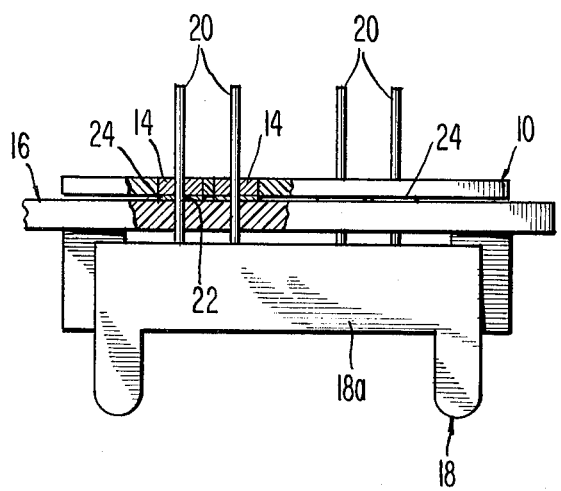
FIG. 3 depicts a non-fusible web of electrically insulative material interposed between an electronic device and a printed circuit board prior to soldering and adapted to remain thereafter as a stand-off and insulator.
Figure 3:
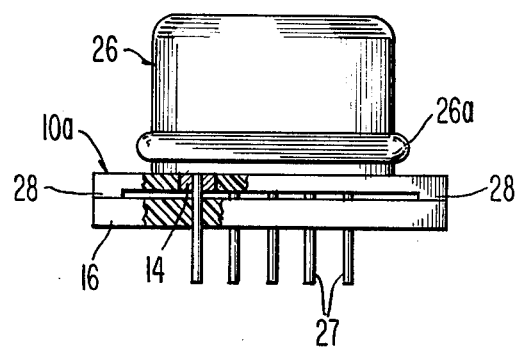

In FIG. 3, it is assumed that the body 26a of the electronic component 26 to be mounted on the printed circuit board 16 is made of electrically conductive material. The web 10a which is chosen to be of electrically insulative material, as well as having the previously mentioned attributes, is loaded with individual solder rings 14 arranged in the configuration of the terminals of the component 26. The web is then interposed between the body of component 26 and the board 16. In preparing the assembly prior to soldering, the terminals 27 are first passed through the solder rings 14 positioned in the web apertures 12, and then through the corresponding openings 22 in the board 16. The body 26a of component 26 then rests upon the web 10a. A dual purpose is now served by web. First, it provides the convenience and soldering efficiency described hereinbefore in connection with the assembly of FIG. 2. Second, instead of being removable as in the last mentioned assembly, it remains permanently in the assembly of FIG. 3 as an electrical insulator and spacer. This eliminates the need for an additional member to perform these functions. It should be noted that the web 10a is advantageously provided with projections or protuberances 28 to elevate the web slightly from the surface of the board 16. This separation permits the cleaning and flushing of the solder flux materials from the surface of the printed circuit board 16.

Figure 4:
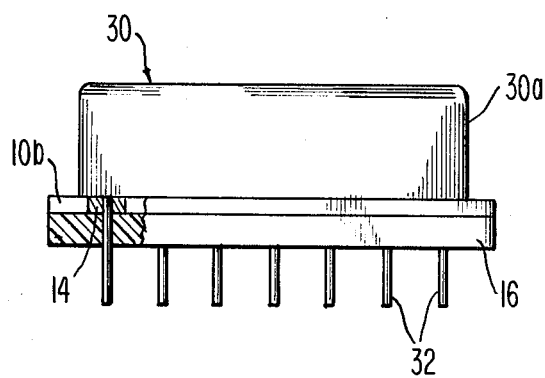
FIG. 4 depicts a non-fusible web disposed between an electrical connector and a printed circuit board prior to soldering, and comprised of soluble material to permit its dissolution after the soldering operation.

In FIG. 4, the web 10b is again interposed between an electrical device 30 and a printed circuit board 16. In this instance, the web 10b is comprised of material which while being non-fusible in the heat of soldering and non-wetted by the solder itself, is nevertheless soluble. Prior to soldering, the body 30a of the device 30 rests upon the web 10b. After the terminals 32 of the device have been soldered to the board 16, a suitable solvent may be applied to the web 10b, thereby dissolving the latter and providing a separation between the board surface with its conductive wiring 24 and the body 30a of the device 30. This air space functions as insulation between the device and the board and permits a thorough cleansing of flux and other impurities from the latter, which may have resulted from the soldering operation.

In conclusion, it is apparent that the non-fusible web of the preform of the present invention offers a simple but effective solution to the problems involved in soldering high density printed circuit board assemblies. It should be understood that changes and modifications of the invention may be needed to suit particular requirements. For example, although for ease of description the web has been illustrated in connection with a single electrical component or device, it is apparent that the web may encompass the entire printed board surface and service a plurality of diverse components, which may then be mounted simultaneously on the board. Such variations and modifications insofar as they are not departures from the true scope of the invention, are intended to be covered by the following claims.

I claim:

1. A solder assembly for electronic device packaging comprising in combination:
    at least one device having a plurality of terminals emanating therefrom,
    an interconnection medium having a plurality of openings for receiving said terminals,
    a multiple solder pre-form having a planar web of material which is non-fusible in the heat attendant with the soldering operation and is non-wetted by solder, said web having a plurality of apertures arranged in a predetermined pattern homologous with that of said plurality of terminals, a plurality of solder rings disposed respectively in said apertures, said web being comprised of electrically insulative material and being interposed between the body of said device and a surface of said interconnection medium, said solder rings encompassing respective ones of said plurality of terminals,
    said web being formed with at least one projection on a surface thereof, said projection providing a separation between the respective adjacent surfaces of said web and said interconnection medium, thereby permitting the cleansing of said interconnection medium of flux deposited thereon during said soldering operation.

* * * * *